(12) United States Patent
Chang

(10) Patent No.: US 10,627,436 B2
(45) Date of Patent: Apr. 21, 2020

(54) CAPACITANCE SENSING CIRCUITS

(71) Applicant: SK hynix Inc., Icheon-si, Gyeonggi-do (KR)

(72) Inventor: Keunjin Chang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 267 days.

(21) Appl. No.: 15/655,292

(22) Filed: Jul. 20, 2017

(65) Prior Publication Data

US 2018/0172744 A1 Jun. 21, 2018

(30) Foreign Application Priority Data

Dec. 21, 2016 (KR) .................. 10-2016-0175754

(51) Int. Cl.
| | | |
|---|---|---|
| *G01R 27/26* | (2006.01) | |
| *G06F 3/0354* | (2013.01) | |
| *G06F 3/044* | (2006.01) | |
| *H03K 17/96* | (2006.01) | |

(52) U.S. Cl.
CPC ..... *G01R 27/2605* (2013.01); *G06F 3/03547* (2013.01); *G06F 3/044* (2013.01); *H03K 17/962* (2013.01); *H03K 2217/960735* (2013.01)

(58) Field of Classification Search
CPC ...... G01C 21/08; G01C 21/20; G01C 25/005; G01R 33/0206; G01R 27/2605; G06F 3/044; G06F 3/03547
USPC .......................................... 324/658
See application file for complete search history.

(56) References Cited

U.S. PATENT DOCUMENTS

| | | | | |
|---|---|---|---|---|
| 4,718,028 A | * | 1/1988 | Gussin ................ | H04N 5/2173 342/159 |
| 5,081,586 A | * | 1/1992 | Barthel ............... | B60R 16/0315 701/49 |
| 5,134,369 A | * | 7/1992 | Lo ...................... | G01R 33/0206 324/202 |
| 5,558,091 A | * | 9/1996 | Acker ................. | A61B 5/062 600/424 |

(Continued)

FOREIGN PATENT DOCUMENTS

| | | | | |
|---|---|---|---|---|
| GB | 2100538 A | * | 12/1982 | ............... H03D 5/00 |
| KR | 0174499 B1 | | 4/1999 | |
| KR | 20140079095 A | | 6/2014 | |

*Primary Examiner* — Christopher P McAndrew
(74) *Attorney, Agent, or Firm* — William Park & Associates Ltd.

(57) ABSTRACT

A capacitance sensing circuit includes a buffer circuit, a modulation circuit, and an integral circuit. The buffer circuit is coupled to an external capacitor through a touch-sensing pad, and includes a pull-up device and a pull-down device. The modulation circuit includes a first current mirror device having a current drivability corresponding to one $N^{th}$ (where "N" denotes a positive real number) a current drivability of the pull-up device and a second current mirror device having a current drivability corresponding to one $N^{th}$ a current drivability of the pull-down device. The integral circuit integrates voltage values at an output node of the modulation circuit to output the integrated voltage values. The pull-up device and the first current mirror device constitute a current mirror circuit, and the pull-down device and the second current mirror device constitute another current mirror circuit.

23 Claims, 8 Drawing Sheets

(56) References Cited

U.S. PATENT DOCUMENTS

| | | | | |
|---|---|---|---|---|
| 5,917,346 A * | 6/1999 | Gord | H03K 7/06 327/101 |
| 6,242,907 B1 * | 6/2001 | Clymer | A61B 5/1121 324/207.17 |
| 6,278,271 B1 * | 8/2001 | Schott | G01R 33/0206 257/422 |
| 7,282,927 B1 * | 10/2007 | Burkatovsky | G05B 19/0425 324/658 |
| 2002/0097144 A1 * | 7/2002 | Collins | G06F 1/3203 340/333 |
| 2004/0232897 A1 * | 11/2004 | Yoshida | H02M 1/08 323/282 |
| 2005/0200351 A1 * | 9/2005 | Shimizu | G01D 5/2086 324/207.15 |
| 2006/0066295 A1 * | 3/2006 | Tamura | G01C 17/38 324/202 |
| 2006/0171081 A1 * | 8/2006 | Breuer | G01R 33/0206 360/313 |
| 2007/0046369 A1 * | 3/2007 | Schober | G06K 19/0707 330/7 |
| 2007/0194787 A1 * | 8/2007 | Takahashi | G01R 33/0206 324/252 |
| 2008/0129282 A1 * | 6/2008 | Lemp | G01R 33/0206 324/202 |
| 2009/0271142 A1 * | 10/2009 | Yamashita | G01D 3/036 702/141 |
| 2009/0315129 A1 * | 12/2009 | Albertini | B81B 7/0006 257/427 |
| 2010/0315102 A1 * | 12/2010 | Portmann | G06F 3/0416 324/680 |
| 2012/0146657 A1 * | 6/2012 | Casillan | G06F 3/0416 324/511 |
| 2012/0176179 A1 * | 7/2012 | Harders | H03K 17/962 327/517 |
| 2013/0063395 A1 * | 3/2013 | Byun | G06F 3/044 345/174 |
| 2013/0069672 A1 * | 3/2013 | Pedersen | G01R 27/26 324/679 |
| 2014/0347045 A1 * | 11/2014 | Paul | G01R 33/072 324/251 |
| 2015/0065164 A1 * | 3/2015 | Hoseinitabatabaei | G01C 21/16 455/456.1 |
| 2016/0084659 A1 * | 3/2016 | Yang | G01C 21/206 702/150 |
| 2016/0091340 A1 * | 3/2016 | Bondar | G01C 25/005 73/1.75 |

* cited by examiner

CAPACITANCE SENSING CIRCUITS

CROSS-REFERENCE TO RELATED APPLICATIONS

The present application claims priority under 35 U.S.C 119(a) to Korean Application number 10-2016-0175754 filed on Dec. 21, 2016, which is herein incorporated by references in its entirety.

BACKGROUND

1. Technical Field

Various embodiments of the present disclosure relate to capacitance sensing circuits.

2. Related Art

Touch screen panels or touch sensor pads are input devices normally arranged on computing systems such as laptop computers and mobile handsets. The touch screen panels may be combined with display panels to input data into the computing systems therethrough, and users may input the data into the computing systems or control the computing system by touching the touch screen panels.

Each of the interface devices such as the touch screen panels may include an array of touch sensors for sensing the users' touch and sensing devices for recognizing the users' touch gestures. The array of the touch sensors may be comprised of, among other things, a large number of capacitors that are two-dimensionally arrayed to detect and store variation of capacitance values of the capacitors touched or pressed by the users.

SUMMARY

Various embodiments are directed to capacitance sensing circuits.

According to an embodiment, a capacitance sensing circuit may include a buffer circuit, a modulation circuit, and an integral circuit. The buffer circuit may be coupled to an external capacitor through a touch-sensing pad, and may include a pull-up device and a pull-down device. The modulation circuit may include a first current mirror device having a current drivability corresponding to one $N^{th}$ (where "N" denotes a positive real number) a current drivability of the pull-up device and a second current mirror device having a current drivability corresponding to one $N^{th}$ a current drivability of the pull-down device. The integral circuit may integrate voltage values at an output node of the modulation circuit to output the integrated voltage values. The pull-up device and the first current mirror device may constitute a current mirror circuit, and the pull-down device and the second current mirror device constitute another current mirror circuit.

According to an embodiment, a capacitance sensing circuit may include a buffer circuit, a first modulation circuit, a second modulation circuit, a third modulation circuit, a fourth modulation circuit, an integral circuit, and a switch. The buffer circuit may be coupled to an external capacitor through a touch-sensing pad, and may include a pull-up device and a pull-down device. The first modulation circuit may include a first current mirror device having a current drivability corresponding to one $N^{th}$ (where "N" denotes a positive real number) a current drivability of the pull-up device and a second current mirror device having a current drivability corresponding to one $N^{th}$ a current drivability of the pull-down device. The pull-up device and the first current mirror device may constitute a current mirror circuit, and the pull-down device and the second current mirror device may constitute another current mirror circuit. The second modulation circuit may include a third current mirror device having a current drivability corresponding to one $N^{th}$ a current drivability of the pull-up device and a first diode-connected device coupled between the third current mirror device and a ground voltage terminal. The pull-up device and the third current mirror device may constitute a current mirror circuit. The third modulation circuit is configured to include a fourth current mirror device having a current drivability corresponding to one $N^{th}$ a current drivability of the pull-down device and a second diode-connected device coupled between a power supply voltage terminal and the fourth current mirror device. The pull-down device and the fourth current mirror device may constitute a current mirror circuit. The fourth modulation circuit may include a fifth current mirror device and a sixth current mirror device. The second diode-connected device and the fifth current mirror device may constitute a current mirror circuit, and the first diode-connected device and the sixth current mirror device may constitute another current mirror circuit. The integral circuit may integrate voltage values at one of output nodes of the first and fourth modulation circuits to output the integrated voltage values. The switch may electrically connect one of the output nodes of the first and fourth modulation circuits to the integral circuit.

BRIEF DESCRIPTION OF THE DRAWINGS

Various embodiments of the present disclosure will become more apparent in view of the attached drawings and accompanying detailed description, in which.

DETAILED DESCRIPTION

In the following description of the embodiments, it will be understood that the terms "first" and "second" are intended to identify an element, but not used to define only the element itself or to mean a particular sequence. In addition, when an element is referred to as being located "on," "over," "above," "under" or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
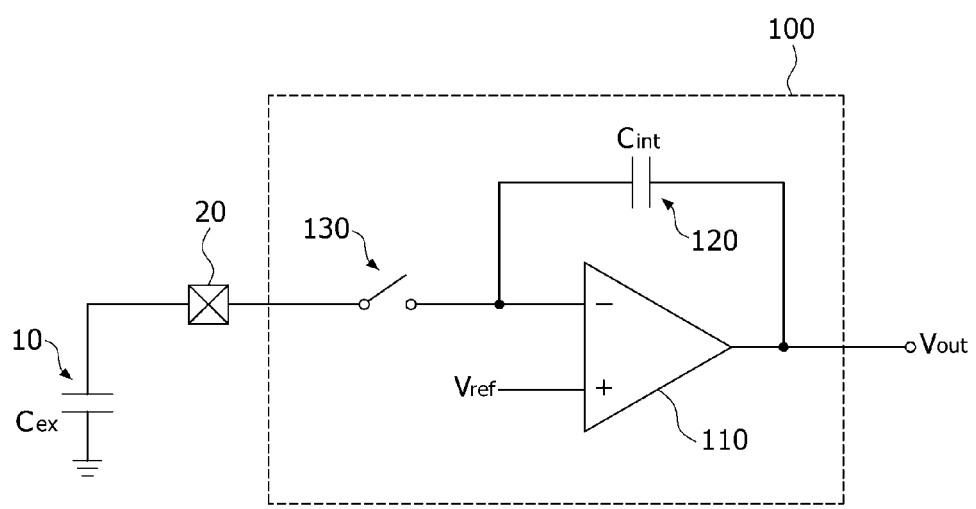
FIG. 1 is a circuit diagram illustrating an example of a general capacitance sensing circuit.

FIG. 1 is a circuit diagram illustrating an example of a general capacitance sensing circuit 100. Referring to FIG. 1, the general capacitance sensing circuit 100 may have an input terminal that is coupled to a touch-sensing pad 20 through a switch 130. The touch-sensing pad 20 may be coupled to an external capacitor 10 corresponding to a sensing target. The input terminal of the general capacitance sensing circuit 100 may be coupled to an inverting input terminal of an operational amplifier 110. A reference voltage Vref may be applied to a non-inverting input terminal of the operational amplifier 110. An internal capacitor 120 may be coupled between an output terminal of the operational amplifier 110 and the inverting input terminal of an operational amplifier 110. The operational amplifier 110 and the internal capacitor 120 may constitute an integrator. The output terminal of the operational amplifier 110 may function as an output terminal of the general capacitance sensing circuit 100.

An output signal Vout of the general capacitance sensing circuit 100 may be expressed by the following equation 1.

$$Vout = -Vref(Cex/Cint) \quad \text{(Equation 1)}$$

In the equation 1, "Cex" denotes a capacitance value of the external capacitor 10, and "Cint" denotes a capacitance value of the internal capacitor 120. As expressed by the equation 1, the output signal Vout of the general capacitance sensing circuit 100 may be determined by a ratio of the capacitance value Cex of the external capacitor 10 to the capacitance value Cint of the internal capacitor 120. Thus, if the capacitance value Cex of the external capacitor 10 increases, it may also be necessary to increase the capacitance value Cint of the internal capacitor 120. This may lead to an increase in the total size of the general capacitance sensing circuit 100, and may also lead to an increase in the power consumption of the general capacitance sensing circuit 100.

Figure 2:
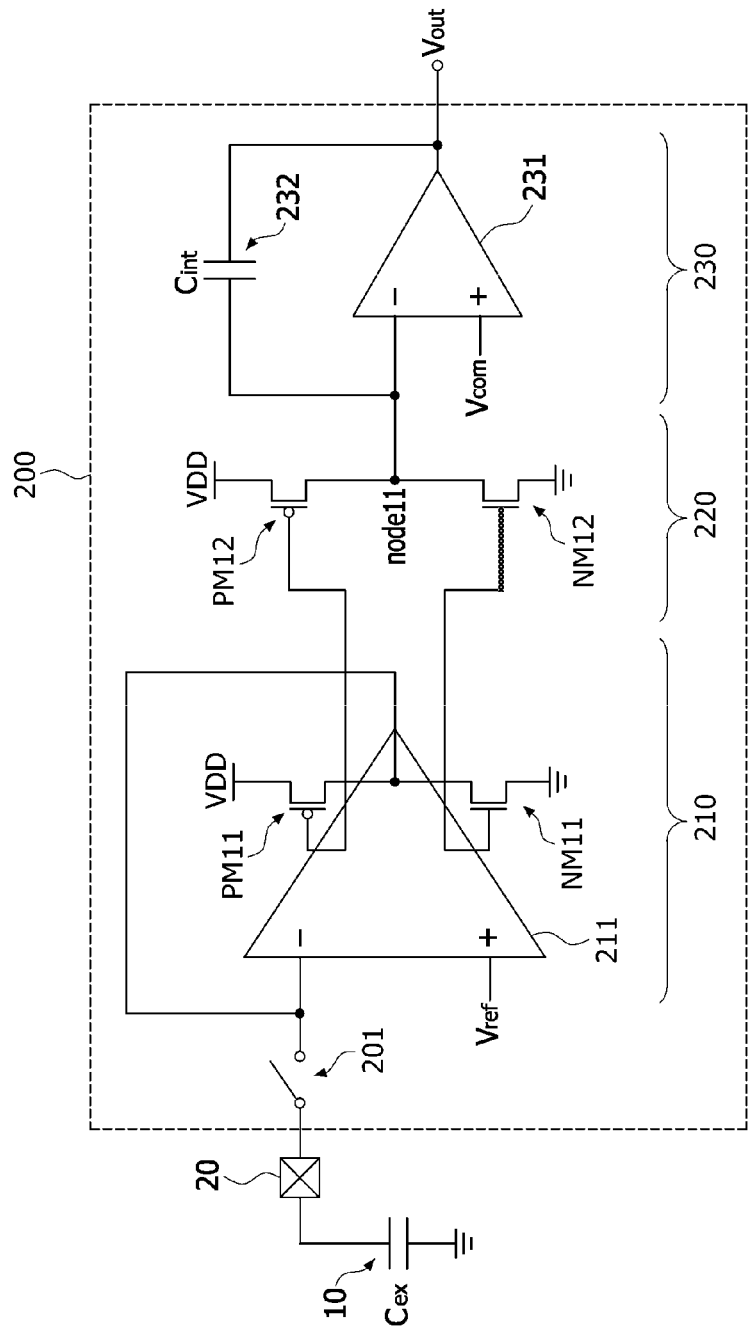
FIG. 2 is a circuit diagram illustrating a capacitance sensing circuit according to an embodiment of the present disclosure.

FIG. 2 is a circuit diagram illustrating a capacitance sensing circuit 200 according to an embodiment of the present disclosure. The capacitance sensing circuit 200 may include a buffer circuit 210, a modulation circuit 220, and an integral circuit 230. The buffer circuit 210 may include a first operational amplifier 211 acting as a buffer. An inverting input terminal of the first operational amplifier 211 may be coupled to a touch-sensing pad (e.g., the touch-sensing pad 20 of FIG. 1) through a switch 201. The touch-sensing pad 20 may be coupled to an external capacitor (e.g., the external capacitor 10 of FIG. 1). A reference voltage Vref may be applied to a non-inverting input terminal of the first operational amplifier 211. An output terminal of the first operational amplifier 211 may be coupled to the inverting input terminal of the first operational amplifier 211. The first operational amplifier 211 may include an output circuit constituting an output stage coupled to an output terminal of the first operational amplifier 211. The output circuit of the first operational amplifier 211 may include a first PMOS transistor PM11 acting as a pull-up device and a first NMOS transistor NM11 acting as a pull-down device. The first PMOS transistor PM11 may have a source coupled to a power supply voltage VDD terminal and a drain coupled to an output node of the output circuit. The first NMOS transistor NM11 may have a source coupled to a ground voltage terminal and a drain coupled to the output node of the output circuit. The output terminal of the first operational amplifier 211 may be coupled to the output node of the output circuit of the first operational amplifier 211 through an output line. Both of the first PMOS transistor PM11 and the first NMOS transistor NM11 may operate in a saturation region.

The modulation circuit 220 may include a second PMOS transistor PM12 acting as a first current mirror device and a second NMOS transistor NM12 acting as a second current mirror device. The second PMOS transistor PM12 may share an output node NODE11 of the modulation circuit 220 with the second NMOS transistor NM12. Specifically, a source of the second PMOS transistor PM12 may be coupled to the power supply voltage VDD terminal, and a drain of the second PMOS transistor PM12 may be coupled to the output node NODE11 of the modulation circuit 220. In addition, a gate of the second PMOS transistor PM12 may be coupled to the pull-up device of the first operational amplifier 211, that is, a gate of the first PMOS transistor PM11. Thus, the first and second PMOS transistors PM11 and PM12 may constitute a current mirror circuit. Moreover, a source of the second NMOS transistor NM12 may be coupled to the ground voltage terminal, and a drain of the second NMOS transistor NM12 may be coupled to the output node NODE11 of the modulation circuit 220. In addition, a gate of the second NMOS transistor NM12 may be coupled to the pull-down device of the first operational amplifier 211, that is, a gate of the first NMOS transistor NM11. Thus, the first and second NMOS transistors NM11 and NM12 may also constitute a current mirror circuit.

The second PMOS transistor PM12 may be designed to have a current drivability corresponding to one $N^{th}$ (1/N) a current drivability of the first PMOS transistor PM11 (where, "N" denotes a positive real number). Similarly, the second NMOS transistor NM12 may be designed to have a current drivability corresponding to one $N^{th}$ (1/N) a current drivability of the first NMOS transistor NM11. In an embodiment, the second PMOS transistor PM12 and the second NMOS transistor NM12 may be designed to have a transconductance value corresponding to one $N^{th}$ (1/N) a transconductance value of the first PMOS transistor PM11 and a transconductance value corresponding to one $N^{th}$ (1/N) a transconductance value of the first NMOS transistor NM11, respectively. For example, the second PMOS transistor PM12 may be designed to have a ratio of a channel width to a channel length corresponding to one $N^{th}$ (1/N) a ratio of a channel width to a channel length of the first PMOS transistor PM11, and the second NMOS transistor NM12 may be designed to have a ratio of a channel width to a channel length corresponding to one $N^{th}$ (1/N) a ratio of a channel width to a channel length of the first NMOS transistor NM11.

Since the first and second PMOS transistors PM11 and PM12 constitute a current mirror circuit in a condition where a current drivability of the second PMOS transistor PM12 is one $N^{th}$ (1/N) a current drivability of the first PMOS transistor PM11, a current flowing from the source of the second PMOS transistor PM12 toward the drain of the second PMOS transistor PM12 may be one $N^{th}$ (1/N) a current flowing from the source of the first PMOS transistor PM11 toward the drain of the first PMOS transistor PM11. Similarly, since the first and second NMOS transistors NM11 and NM12 constitute a current mirror circuit in a condition where a current drivability of the second NMOS transistor NM12 is one $N^{th}$ (1/N) a current drivability of the first NMOS transistor NM11, a current flowing from the drain of the second NMOS transistor NM12 toward the source of the second NMOS transistor NM12 may be one $N^{th}$ (1/N) a current flowing from the drain of the first NMOS transistor NM11 toward the source of the first NMOS transistor NM11.

The integral circuit 230 may include a second operational amplifier 231, which integrates voltage values at the output node NODE11 of the modulation circuit 220 to output the integrated voltage values. An inverting input terminal of the second operational amplifier 231 may be coupled to the output node NODE11 of the modulation circuit 220. A common voltage Vcom may be applied to a non-inverting input terminal of the second operational amplifier 231. The common voltage Vcom may be a bias voltage used in an operation of the second operational amplifier 231, and may be a constant voltage. An internal capacitor 232 may be coupled between an output terminal of the second operational amplifier 231 and the inverting input terminal of the second operational amplifier 231. An output voltage signal Vout may be output through the output terminal of the second operational amplifier 231. The output voltage signal Vout may be expressed by the following equation 2.

$$Vout = Vref \times Cex \times (1/N) \times (1/Cint) \quad \text{(Equation 2)}$$

Figure 3:
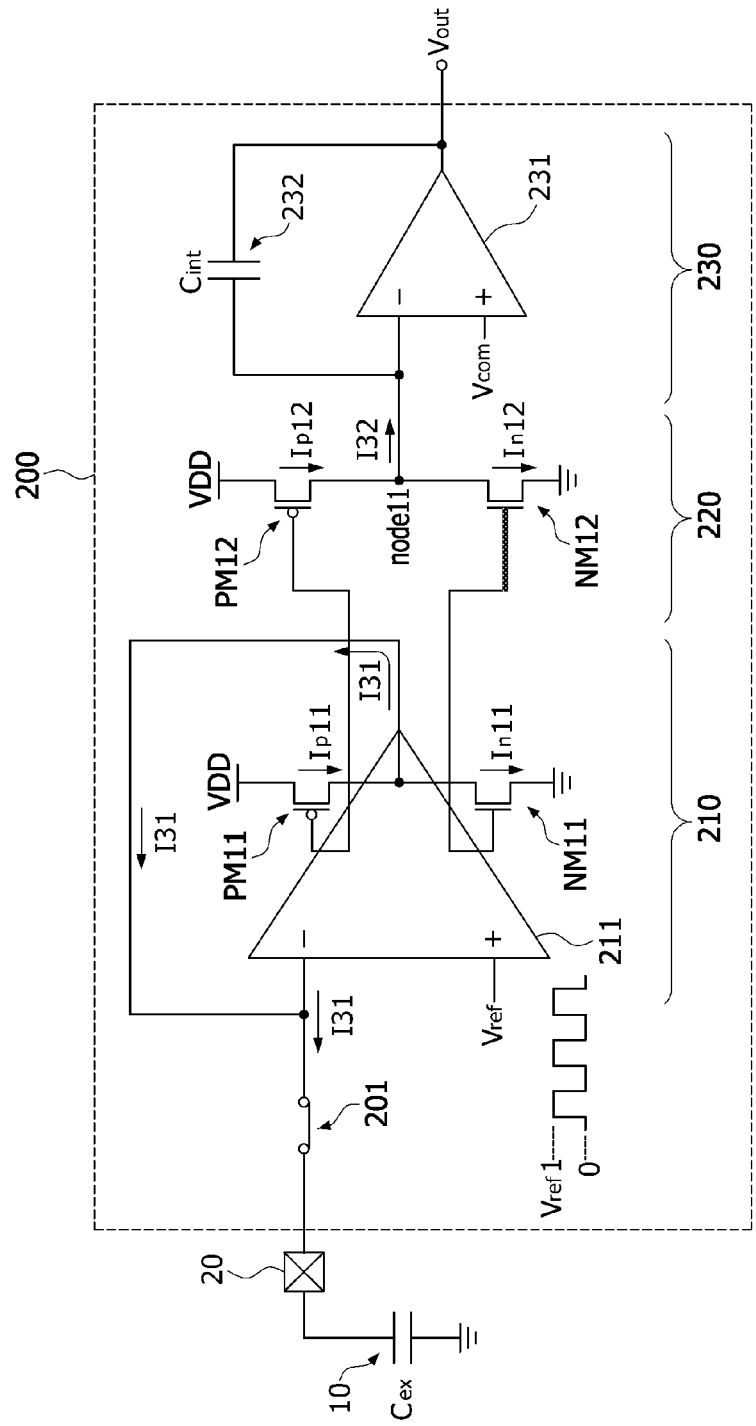
FIG. 3 is a circuit diagram illustrating an operation of the capacitance sensing circuit illustrated in FIG. 2.

FIG. 3 is a circuit diagram illustrating an operation of the capacitance sensing circuit 200 shown in FIG. 2. In FIG. 3, the same reference numerals or the same reference designators as used in FIG. 2 denote the same elements. Thus, to avoid duplicate explanation, descriptions of the same elements as those set forth with reference to FIG. 2 will be omitted or briefly mentioned hereinafter. Referring to FIG. 3, if the switch 201 is turned on, a voltage of the touch-sensing pad 20 may be applied to the inverting input terminal of the first operational amplifier 211. The voltage of the touch-sensing pad 20 may be determined by an amount of electric charges in the external capacitor 10. The reference voltage Vref applied to the non-inverting input terminal of the first operational amplifier 211 may be a periodic signal such as a clock signal having a pulse waveform. For example, the reference voltage Vref may be a pulse signal that toggles between a low level having a ground voltage and a high level having a first reference voltage Vref1. In an embodiment, the first reference voltage Vref1 may be set to be higher than a maximum voltage of the touch-sensing pad 20.

During a first period when the first reference voltage Vref1 of the reference voltage Vref is applied to the non-inverting input terminal of the first operational amplifier 211, a current Ip11 flowing through the first PMOS transistor PM11 of the output circuit of the first operational amplifier 211 may be divided into a current In11 flowing through the first NMOS transistor NM11 of the output circuit of the first operational amplifier 211 and a first output current I31 flowing through the output line of the first operational amplifier 211. The first output current I31 may flow through the output terminal of the first operational amplifier 211 and along a feedback path of the first operational amplifier 211. The first output current I31 may correspond to a current that remains after subtracting the current In11 flowing through the first NMOS transistor NM11 from the current Ip11 flowing through the first PMOS transistor PM11. This relationship between the currents Ip11, In11 and I31 may be expressed by the following equation 3.

$$I31 = Ip11 - In11 \quad \text{(Equation 3)}$$

Since the first and second PMOS transistors PM11 and PM12 constitute a current mirror circuit in a condition where a current drivability of the second PMOS transistor PM12 is one $N^{th}$ (1/N) a current drivability of the first PMOS transistor PM11, a current Ip12 flowing through the second PMOS transistor PM12 may be one $N^{th}$ (1/N) the current Ip11 flowing through the first PMOS transistor PM11. Similarly, since the first and second NMOS transistors NM11 and NM12 constitute a current mirror circuit in a condition where a current drivability of the second NMOS transistor NM12 is one $N^{th}$ (1/N) a current drivability of the first NMOS transistor NM11, a current In12 flowing through the second NMOS transistor NM12 may be one $N^{th}$ (1/N) the current In11 flowing through the first NMOS transistor NM11. A second output current I32 flowing toward the inverting input terminal of the second operational amplifier 231 through the output node NODE11 of the modulation circuit 220 may correspond to a current that remains after subtracting the current In12 flowing through the second NMOS transistor NM12 from the current Ip12 flowing through the second PMOS transistor PM12. The current Ip12 flowing through the second PMOS transistor PM12 is one $N^{th}$ (1/N) the current Ip11 flowing through the first PMOS transistor PM11, and the current In12 flowing through the second NMOS transistor NM12 is one $N^{th}$ (1/N) the current In11 flowing through the first NMOS transistor NM11. Therefore, the second output current I32 may be expressed by the following equation 4.

$$I32 = Ip12 - In12 = (1/N) \times (Ip11 - In11) = (1/N) \times I31 \quad \text{(Equation 4)}$$

As expressed by the equation 4, the second output current I32 flowing through the output node NODE11 of the modulation circuit 220 may be one $N^{th}$ (1/N) the first output current I31 output though the output terminal of the first operational amplifier 211. In such a case, a voltage induced at the inverting input terminal of the second operational amplifier 231 may be determined depending on the second output current I32 flowing through the output node NODE11 of the modulation circuit 220. That is, the voltage induced at the inverting input terminal of the second operational amplifier 231 may be one $N^{th}$ (1/N) a voltage induced at the touch-sensing pad 20 by the external capacitor 10. As denoted by the equation 2, since the output voltage Vout is proportional to one $N^{th}$ (1/N) the ratio of the capacitance value Cex of the external capacitor 10 to the capacitance value Cint of the internal capacitor 232, the output voltage signal Vout may be less sensitive to variations of the capacitance value Cex and the capacitance value Cint than the output signal Vout of the general capacitance sensing circuit 100 illustrated in FIG. 1. That is, even if the capacitance value Cint of the internal capacitor 232 is less than the capacitance value Cex of the external capacitor 10, the capacitance sensing circuit 200 in accordance with an embodiment may reduce the influence of the capacitance deviation between the external capacitor 10 and the internal capacitor 232 on the output voltage signal Vout of the capacitance sensing circuit 200.

During a second period, the ground voltage of the reference voltage Vref is applied to the non-inverting input terminal of the first operational amplifier 211. An operation of the capacitance sensing circuit 200 during the second period may be substantially the same as the operation of the capacitance sensing circuit 200 performed during the first period except that a phase of the output voltage signal Vout generated during the second period is opposite to a phase of the output voltage signal Vout generated during the first period. That is, the output voltage signal Vout generated during the first period and the output voltage signal Vout generated during the second period may have the same magnitude but opposite phases.

Figure 4:
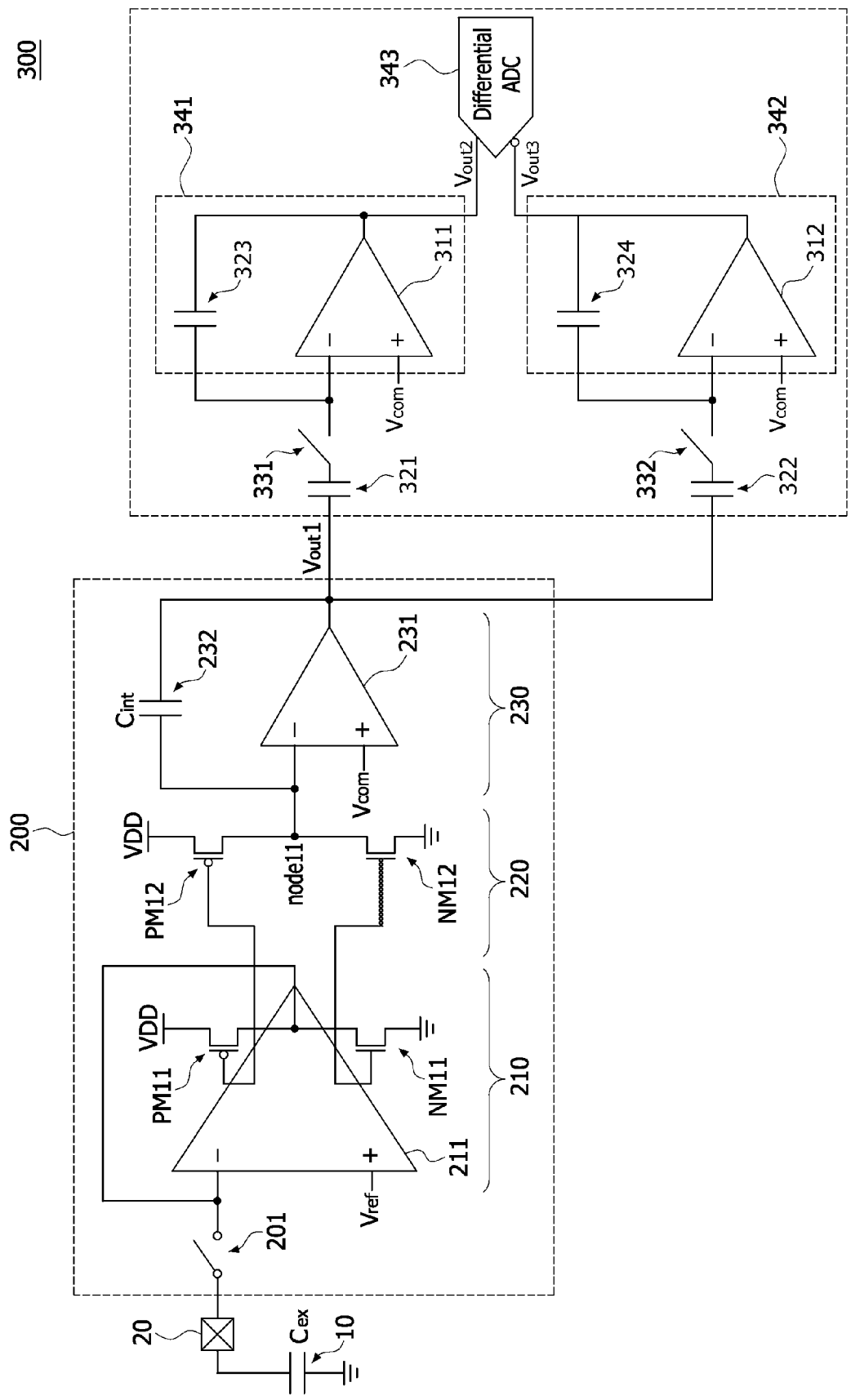
FIG. 4 is a circuit diagram illustrating a capacitance sensing circuit according to an embodiment of the present disclosure.

FIG. 4 is a circuit diagram illustrating a capacitance sensing circuit 300 according to an embodiment of the present disclosure. Referring to FIG. 4, the capacitance sensing circuit 300 may include a sampling circuit and a differential analog-digital converter (ADC) 343 in addition to the buffer circuit 210, the modulation circuit 220, and the integral circuit 230, which are described with reference to FIG. 2. The sampling circuit may include a first sampling device 341 and a second sampling device 342. To avoid duplicate explanation, descriptions of the buffer circuit 210, the modulation circuit 220 and the integral circuit 230 will be omitted or briefly mentioned hereinafter.

The first sampling device 341 and the second sampling device 342 may be coupled in parallel to the output terminal of the integral circuit 230 (i.e., the output terminal of the second operational amplifier 231). The first sampling device 341 may include a first sampling capacitor 321, a third operation amplifier 311, and a first feedback capacitor 323. The first sampling capacitor 321 may be coupled to the output terminal of the second operational amplifier 231. An inverting input terminal of the third operation amplifier 311 may be coupled to the first sampling capacitor 321 through a first switch 331, and a common voltage Vcom may be applied to a non-inverting input terminal of the third operation amplifier 311. The first feedback capacitor 323 may be coupled between an output terminal of the third operation amplifier 311 and the inverting input terminal of the third operation amplifier 311. The second sampling device 342 may include a second sampling capacitor 322, a fourth operation amplifier 312, and a second feedback capacitor 324. The second sampling capacitor 322 may be coupled to the output terminal of the second operational amplifier 231. Accordingly, the first and second sampling capacitors 321 and 322 may be coupled in parallel to the output terminal of the second operational amplifier 231. An inverting input terminal of the fourth operation amplifier 312 may be coupled to the second sampling capacitor 322 through a second switch 332, and the common voltage Vcom may be applied to a non-inverting input terminal of the fourth operation amplifier 312. The second feedback capacitor 324 may be coupled between an output terminal of the fourth operation amplifier 312 and the inverting input terminal of the fourth operation amplifier 312.

The first and second sampling capacitors 321 and 322 may start to be charged when a first output voltage signal Vout1 is generated and output from the second operational amplifier 231. If first and second sampling capacitors 321 and 322 are charged enough to perform predetermined operations, the first switch 331 may be turned on, and a first sampling step may be performed by the first sampling device 341. If the first switch 331 is turned on, the first output voltage signal Vout1 may be amplified according to a ratio of a capacitance value of the first sampling capacitor 321 to a capacitance value of the first feedback capacitor 323. A second output voltage signal Vout2 may also be sampled on the basis of the common voltage Vcom input to the non-inverting input terminal of the third operational amplifier 311, and may be output through an output terminal of the third operational amplifier 311. A second sampling step may be performed by the second sampling device 342 after the first sampling step is performed. That is, if the first switch 331 is turned off and the second switch 332 is turned on, the first output voltage signal Vout1 may be amplified according to a ratio of a capacitance value of the second sampling capacitor 322 to a capacitance value of the second feedback capacitor 324. A third output voltage signal Vout3 may also be sampled on the basis of the common voltage Vcom input to the non-inverting input terminal of the fourth operational amplifier 312, and may be output through an output terminal of the fourth operational amplifier 312. In an embodiment, the second sampling step may be performed after a time corresponding to a half cycle of a clock signal elapses from a point in time when the first sampling step is performed. In such a case, a phase difference between the second and third output voltage signals Vout2 and Vout3 may correspond to a half cycle of the clock signal.

The differential ADC 343 may receive the second output voltage signal Vout2 output from the output terminal of the third operational amplifier 311 and the third output voltage signal Vout3 output from the output terminal of the fourth operational amplifier 312. The differential ADC 343 may perform a differential analog-to-digital converting operation on the second and third output voltage signals Vout2 and Vout3 to generate a digital output signal.

A transfer function H(z) of the first output voltage signal Vout1 output from the second operational amplifier 231 in a Z-domain may be expressed by an equation "$(1-z^{-1})$." In addition, a transfer function H(z) of the second and third output voltage signals Vout2 and Vout3 output from the first and second sampling devices 341 and 342 in a Z-domain may be expressed by an equation "$(1-z^{-1})^2$." Moreover, a transfer function H(z) of a signal output from the differential ADC 343 in a Z-domain may be expressed by an equation "$(1-z^{-1})^3$." As such, the capacitance sensing circuit 300 may perform a third-order correlated double sampling process to suppress or reduce a noise of a final output signal.

Figure 5:
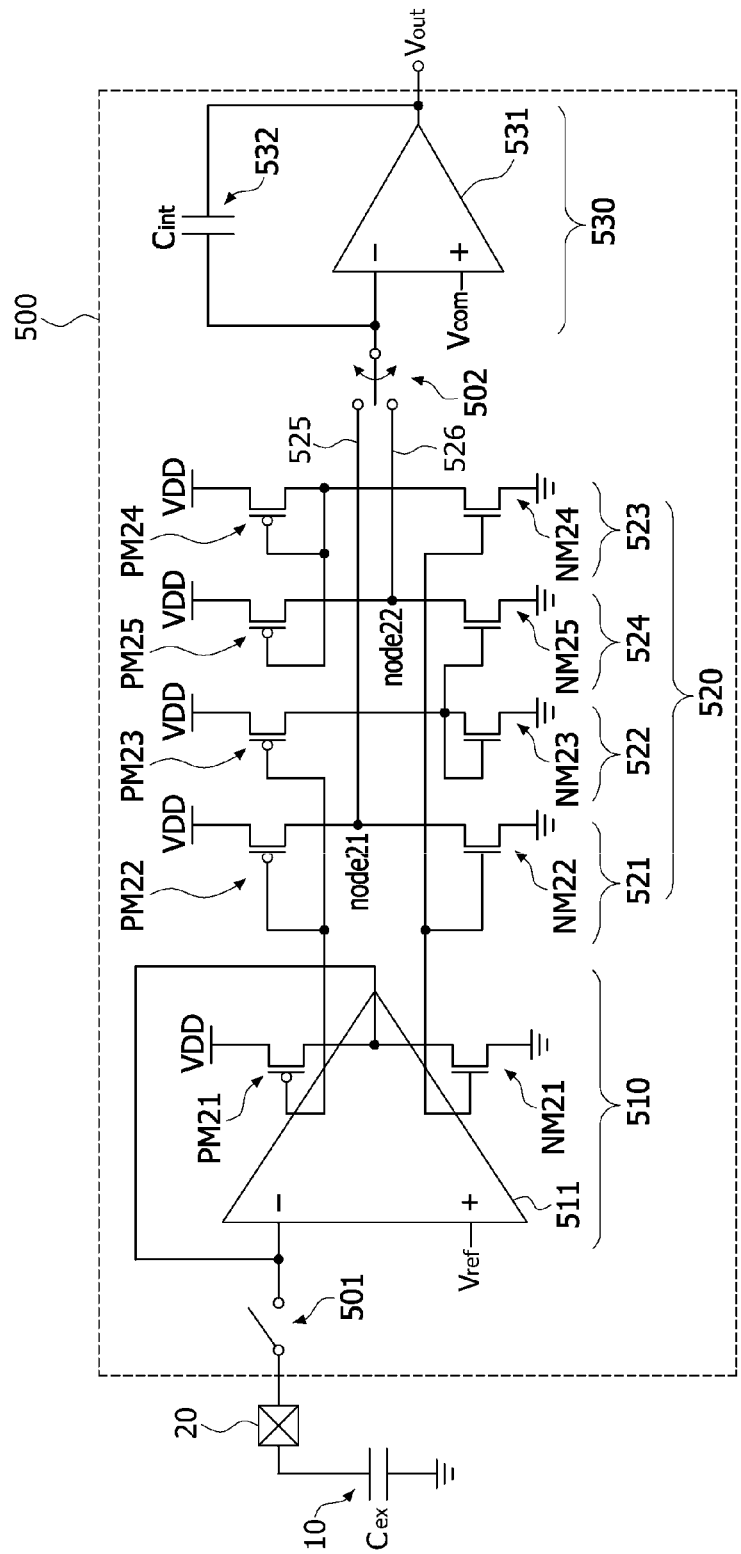
FIG. 5 is a circuit diagram illustrating a capacitance sensing circuit according to an embodiment of the present disclosure.

FIG. 5 is a circuit diagram illustrating a capacitance sensing circuit 500 according to an embodiment of the present disclosure. Referring to FIG. 5, the capacitance sensing circuit 500 may include a buffer circuit 510, a modulation circuit 520, and an integral circuit 530. The buffer circuit 510 may include a first operational amplifier 511 acting as a buffer. An inverting input terminal of the first operational amplifier 511 may be coupled to a touch-sensing pad (e.g., the touch-sensing pad 20 of FIG. 1) through a switch 501. The touch-sensing pad 20 may be coupled to an external capacitor (e.g., the external capacitor 10 of FIG. 1). A reference voltage Vref may be applied to a non-inverting input terminal of the first operational amplifier 511. An output terminal of the first operational amplifier 511 may be coupled to the inverting input terminal of the first operational amplifier 511. The first operational amplifier 511 may include an output circuit coupled to an output terminal of the first operational amplifier 511. The output circuit of the first operational amplifier 511 may include a first PMOS transistor PM21 acting as a pull-up device and a first NMOS transistor NM21 acting as a pull-down device. The first PMOS transistor PM21 may have a source coupled to a power supply voltage VDD terminal and a drain coupled to an output node of the output circuit. The first NMOS transistor NM21 may have a source coupled to a ground voltage terminal and a drain coupled to the output node of the output circuit. The output terminal of the first operational amplifier 511 may be coupled to the output node of the output circuit of the first operational amplifier 511 through an output line. Both of the first PMOS transistor PM21 and the first NMOS transistor NM21 may operate in a saturation region.

The modulation circuit 520 may include a first modulation circuit 521, a second modulation circuit 522, a third modulation circuit 523, and a fourth modulation circuit 524. The first modulation circuit 521 may generate a first output current flowing through a first output line 525 during a first period when a first reference voltage Vref1 (having a high level) of the reference voltage Vref is applied to the non-inverting input terminal of the first operational amplifier 511. The fourth modulation circuit 524 may generate a second output current flowing through a second output line 526 during a second period when a ground voltage (having a low level) of the reference voltage Vref is applied to the non-inverting input terminal of the first operational amplifier 511. The second and third modulation circuits 522 and 523 may provide current paths through which current components unnecessary for the generation of the second output current may be bypassed.

The first modulation circuit 521 may include a first current mirror device and a second current mirror device, which share a first output node NODE21 corresponding to an output node of the first modulation circuit 521. The first current mirror device may be comprised of a second PMOS transistor PM22, and the second current mirror device may be comprised of a second NMOS transistor NM22. A source of the second PMOS transistor PM22 may be coupled to the power supply voltage VDD terminal, and a drain of the second PMOS transistor PM22 may be coupled to the first output node NODE21. A gate of the second PMOS transistor PM22 may be coupled to a gate of the first PMOS transistor PM21 acting as a pull-up device of the output circuit of the first operational amplifier 511. Thus, the first and second PMOS transistors PM21 and PM22 may constitute a current mirror circuit. A source of the second NMOS transistor NM22 may be coupled to the ground voltage terminal, and a drain of the second NMOS transistor NM22 may be coupled to the first output node NODE21. A gate of the second NMOS transistor NM22 may be coupled to a gate of the first NMOS transistor NM21 acting as a pull-down device of the output circuit of the first operational amplifier 511. Thus, the first and second NMOS transistors NM21 and NM22 may constitute a current mirror circuit.

The second PMOS transistor PM22 may be designed to have a current drivability corresponding to one $N^{th}$ (1/N) a current drivability of the first PMOS transistor PM21 (where "N" denotes a positive real number). Similarly, the second NMOS transistor NM22 may be designed to have a current drivability corresponding to one $N^{th}$ (1/N) a current drivability of the first NMOS transistor NM21. In an embodiment, the second PMOS transistor PM22 and the second NMOS transistor NM22 may be designed to have a transconductance value corresponding to one $N^{th}$ (1/N) a transconductance value of the first PMOS transistor PM21 and a transconductance value corresponding to one $N^{th}$ (1/N) a transconductance value of the first NMOS transistor NM21, respectively. For example, the second PMOS transistor PM22 may be designed to have a ratio of a channel width to a channel length corresponding to one $N^{th}$ (1/N) a ratio of a channel width to a channel length of the first PMOS transistor PM21, and the second NMOS transistor NM22 may be designed to have a ratio of a channel width to a channel length corresponding to one $N^{th}$ (1/N) a ratio of a channel width to a channel length of the first NMOS transistor NM21.

Since the first and second PMOS transistors PM21 and PM22 constitute a current mirror circuit in a condition where a current drivability of the second PMOS transistor PM22 is one $N^{th}$ (1/N) a current drivability of the first PMOS transistor PM21, a current flowing from the source of the second PMOS transistor PM22 toward the drain of the second PMOS transistor PM22 may be one $N^{th}$ (1/N) a current flowing from the source of the first PMOS transistor PM21 toward the drain of the first PMOS transistor PM21. Similarly, since the first and second NMOS transistors NM21 and NM22 constitute a current mirror circuit in a condition where a current drivability of the second NMOS transistor NM22 is one $N^{th}$ (1/N) a current drivability of the first NMOS transistor NM21, a current flowing from the drain of the second NMOS transistor NM22 toward the source of the second NMOS transistor NM22 may be one $N^{th}$ (1/N) a current flowing from the drain of the first NMOS transistor NM21 toward the source of the first NMOS transistor NM21.

The second modulation circuit 522 may include a third current mirror device and a first diode-connected device. The third current mirror device may be comprised of a third PMOS transistor PM23, and the first diode-connected device may be comprised of a third NMOS transistor NM23. A source of the third PMOS transistor PM23 may be coupled to the power supply voltage VDD terminal, and a drain of the third PMOS transistor PM23 may be coupled to a drain of the third NMOS transistor NM23. A gate of the third PMOS transistor PM23 may be coupled to a gate of the first PMOS transistor PM21 acting as a pull-up device of the output circuit of the first operational amplifier 511. Thus, the first and third PMOS transistors PM21 and PM23 may constitute a current mirror circuit. A source of the third NMOS transistor NM23 may be coupled to the ground voltage terminal, and a drain of the third NMOS transistor NM23 may be coupled to the drain of the third PMOS transistor PM23. A gate and the drain of the third NMOS transistor NM23 may be coupled to each other.

The third PMOS transistor PM23 may be designed to have a current drivability corresponding to one $N^{th}$ (1/N) a current drivability of the first PMOS transistor PM21 (where, "N" denotes a positive real number). The third NMOS transistor NM23 may be designed to have at least a current drivability of the third PMOS transistor PM23. In an embodiment, the third PMOS transistor PM23 and the third NMOS transistor NM23 may be designed to have a transconductance value corresponding to one $N^{th}$ (1/N) a transconductance value of the first PMOS transistor PM21. For example, the third PMOS transistor PM23 and the third NMOS transistor NM23 may be designed to have a ratio of a channel width to a channel length corresponding to one $N^{th}$ (1/N) a ratio of a channel width to a channel length of the first PMOS transistor PM21.

Since the first and third PMOS transistors PM21 and PM23 constitute a current mirror circuit in a condition where a current drivability of the third PMOS transistor PM23 is one $N^{th}$ (1/N) a current drivability of the first PMOS transistor PM21, a current flowing from the source of the third PMOS transistor PM23 toward the drain of the third PMOS transistor PM23 may be one $N^{th}$ (1/N) a current flowing from the source of the first PMOS transistor PM21 toward the drain of the first PMOS transistor PM21. Since the third NMOS transistor NM23 is a diode-connected transistor, a current flowing through the third PMOS transistor PM23 may be substantially equal to a current flowing through the third NMOS transistor NM23.

The third modulation circuit 523 may include a fourth current mirror device and a second diode-connected device. The fourth current mirror device may be comprised of a fourth NMOS transistor NM24, and the second diode-connected device may be comprised of a fourth PMOS transistor PM24. A drain of the fourth NMOS transistor NM24 may be coupled to a drain of the fourth PMOS transistor PM24, and a source of the fourth NMOS transistor NM24 may be coupled to the ground voltage terminal. A gate of the fourth NMOS transistor NM24 may be coupled to a gate of the first NMOS transistor NM21 acting as a pull-down device of the output circuit of the first operational amplifier 511. Thus, the first and fourth NMOS transistors NM21 and NM24 may constitute a current mirror circuit. A source of the fourth PMOS transistor PM24 may be coupled to the power supply voltage VDD terminal, and a drain of the fourth PMOS transistor PM24 may be coupled to the drain of the fourth NMOS transistor NM24. A gate and the drain of the fourth PMOS transistor PM24 may be coupled to each other.

The fourth NMOS transistor NM24 may be designed to have a current drivability corresponding to one $N^{th}$ (1/N) a current drivability of the first NMOS transistor NM21 (where "N" denotes a positive real number). The fourth PMOS transistor PM24 may be designed to have at least a current drivability of the fourth NMOS transistor NM24. In an embodiment, the fourth NMOS transistor NM24 and the fourth PMOS transistor PM24 may be designed to have a transconductance value corresponding to one $N^{th}$ (1/N) a transconductance value of the first NMOS transistor NM21. For example, the fourth NMOS transistor NM24 and the fourth PMOS transistor PM24 may be designed to have a ratio of a channel width to a channel length corresponding to one $N^{th}$ (1/N) a ratio of a channel width to a channel length of the first NMOS transistor NM21.

Since the first and fourth NMOS transistors NM21 and NM24 constitute a current mirror circuit in a condition where a current drivability of the fourth NMOS transistor NM24 is one $N^{th}$ (1/N) a current drivability of the first NMOS transistor NM21, a current flowing from the drain of the fourth NMOS transistor NM24 toward the source of the fourth NMOS transistor NM24 may be one $N^{th}$ (1/N) a current flowing from the drain of the first NMOS transistor NM21 toward the source of the first NMOS transistor NM21. Since the fourth PMOS transistor PM24 is a diode-connected transistor, a current flowing through the fourth NMOS transistor NM24 may be substantially equal to a current flowing through the fourth PMOS transistor PM24.

The fourth modulation circuit 524 may include a fifth current mirror device and a sixth current mirror device, which share a second output node NODE22 of the fourth modulation circuit 524. The fifth current mirror device may be comprised of a fifth PMOS transistor PM25, and the sixth current mirror device may be comprised of a fifth NMOS transistor NM25. A source of the fifth PMOS transistor PM25 may be coupled to the power supply voltage VDD terminal, and a drain of the fifth PMOS transistor PM25 may be coupled to the second output node NODE22. A gate of the fifth PMOS transistor PM25 may be coupled to a gate of the fourth PMOS transistor PM24. Thus, the fourth and fifth PMOS transistors PM24 and PM25 may constitute a current mirror circuit. A source of the fifth NMOS transistor NM25 may be coupled to the ground voltage terminal, and a drain of the fifth NMOS transistor NM25 may be coupled to the second output node NODE22. A gate of the fifth NMOS transistor NM25 may be coupled to a gate of the third NMOS transistor NM23. Thus, the third and fifth NMOS transistors NM23 and NM25 may constitute a current mirror circuit.

The fifth PMOS transistor PM25 may be designed to have a current drivability that is substantially equal to a current drivability of the fourth PMOS transistor PM24. The fifth NMOS transistor NM25 may be designed to have a current drivability that is substantially equal to a current drivability of the third NMOS transistor NM23. Thus, a current flowing through fifth PMOS transistor PM25 may be substantially equal to a current flowing through the fourth PMOS transistor PM24, and a current flowing through fifth NMOS transistor NM25 may be substantially equal to a current flowing through the third NMOS transistor NM23.

The integral circuit 530 may include a second operational amplifier 531, which integrates voltage values at an output terminal of the modulation circuit 520 to output the integrated voltage values. An inverting input terminal of the second operational amplifier 531 may be coupled to one of the first output node NODE21 (e.g., an output terminal of the first modulation circuit 521) and the second output node NODE22 (e.g., an output terminal of the fourth modulation circuit 524) according to an operation of a switch 502. A common voltage Vcom may be applied to a non-inverting input terminal of the second operational amplifier 531. The common voltage Vcom may be a bias voltage used in an operation of the second operational amplifier 531, and may be a constant voltage. An internal capacitor 532 may be coupled between an output terminal of the second operational amplifier 531 and the inverting input terminal of the second operational amplifier 531. An output voltage signal Vout may be output through the output terminal of the second operational amplifier 531.

Figure 6:
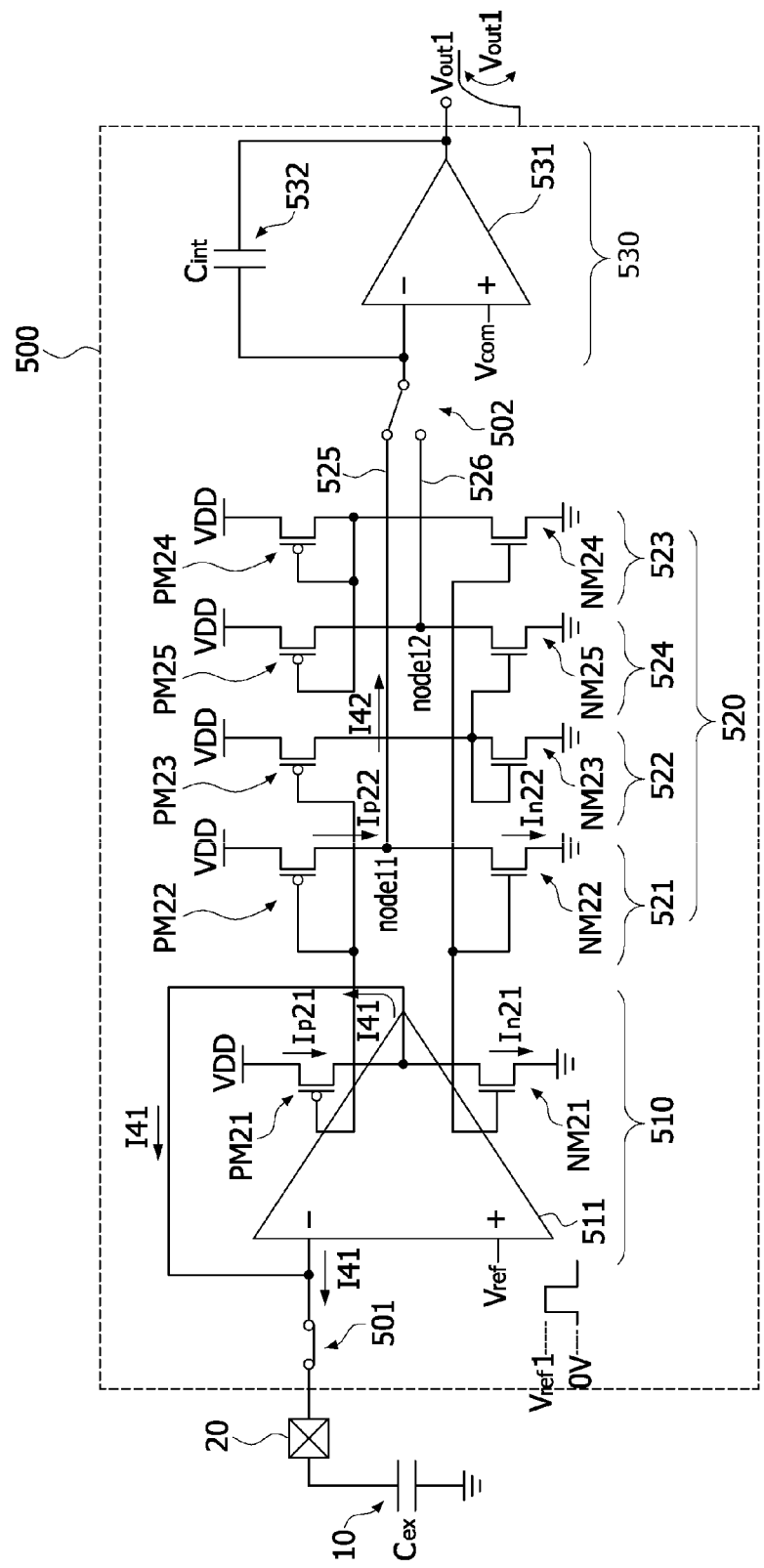
FIG. 6 is a circuit diagram illustrating a first operation step of the capacitance sensing circuit illustrated in FIG. 5.

FIG. 6 is a circuit diagram illustrating a first operation step of the capacitance sensing circuit 500 illustrated in FIG. 5. In FIG. 6, the same reference numerals or the same reference designators as those used in FIG. 5 denote the same elements. Thus, to avoid duplicate explanation, descriptions of the same elements as those set forth with reference to FIG. 5 will be omitted or briefly mentioned hereinafter. Referring to FIG. 6, if the switch 501 is turned on, a voltage of the touch-sensing pad 20 may be applied to the inverting input terminal of the first operational amplifier 511. The voltage of the touch-sensing pad 20 may be determined by an amount of electric charges in the external capacitor 10. The reference voltage Vref applied to the non-inverting input terminal of the first operational amplifier 511 may be a periodic signal such as a clock signal having a pulse waveform. For example, the reference voltage Vref may be a pulse signal that toggles between a low level having a ground voltage and a high level having a first reference voltage Vref1. In an embodiment, the first reference voltage Vref1 may be set to be higher than a maximum voltage of the touch-sensing pad 20.

During a first period when the first reference voltage Vref1 of the reference voltage Vref is applied to the non-inverting input terminal of the first operational amplifier 511, the switch 502 disposed between the modulation circuit 520 and the integral circuit 530 may connect the inverting input terminal of the second operational amplifier 531 to the first output line 525 extending from the first output node NODE21. In such a case. a current Ip21 flowing through the first PMOS transistor PM21 of the output circuit of the first operational amplifier 511 may be divided into a current In21 flowing through the first NMOS transistor NM21 of the output circuit of the first operational amplifier 511 and an output current I41 flowing through the output line of the first operational amplifier 511. The output current I41 may flow through the output terminal of the first operational amplifier 511 and along a feedback path of the first operational amplifier 511. The output current I41 may correspond to a current that remains after subtracting the current In21 flowing through the first NMOS transistor NM21 from the current Ip21 flowing through the first PMOS transistor PM21.

Since the first and second PMOS transistors PM21 and PM22 constitute a current mirror circuit in a condition where a current drivability of the second PMOS transistor PM22 is one $N^{th}$ (1/N) a current drivability of the first PMOS transistor PM21, a current Ip22 flowing through the second PMOS transistor PM22 may be one $N^{th}$ (1/N) the current Ip21 flowing through the first PMOS transistor PM21. Similarly, since the first and second NMOS transistors NM21 and NM22 constitute a current mirror circuit in a condition where a current drivability of the second NMOS transistor NM22 is one $N^{th}$ (1/N) a current drivability of the first NMOS transistor NM21, a current In22 flowing through the second NMOS transistor NM22 may be one $N^{th}$ (1/N) the current In21 flowing through the first NMOS transistor NM21. A first output current I42 flowing along the first output line 525 through the first output node NODE21 of the first modulation circuit 521 may correspond to a current that remains after subtracting the current In22 flowing through the second NMOS transistor NM22 from the current Ip22 flowing through the second PMOS transistor PM22.

Since the current Ip22 flowing through the second PMOS transistor PM22 is one $N^{th}$ (1/N) the current Ip21 flowing through the first PMOS transistor PM21 in a condition where the current In22 flowing through the second NMOS transistor NM22 is one $N^{th}$ (1/N) the current In21 flowing through the first NMOS transistor NM21, the first output current I42 may be one $N^{th}$ (1/N) the output current I41 output through the output terminal of the first operational amplifier 511. Thus, a voltage induced at the inverting input terminal of the second operational amplifier 531 may be determined depending on the first output current I42 flowing along the first output line 525. That is, the voltage induced at the inverting input terminal of the second operational amplifier 531 may be one $N^{th}$ (1/N) a voltage induced at the touch-sensing pad 20 by the external capacitor 10. Since the output voltage signal Vout1 is the product of a ratio of the capacitance value Cex of the external capacitor 10 to the capacitance value Cint of the internal capacitor 532, one $N^{th}$ (1/N), and the first reference voltage value (Vref1), the output voltage signal Vout1 may be less sensitive to variations of the capacitance value Cex and the capacitance value Cint than the output signal Vout of the general capacitance sensing circuit 100 illustrated in FIG. 1. That is, even if the capacitance value Cint of the internal capacitor 532 is less than the capacitance value Cex of the external capacitor 10, the capacitance sensing circuit 500 in accordance with an embodiment may reduce the influence of the capacitance deviation between the external capacitor 10 and the internal capacitor 532 on the output voltage signal Vout1 of the capacitance sensing circuit 500.

Figure 7:
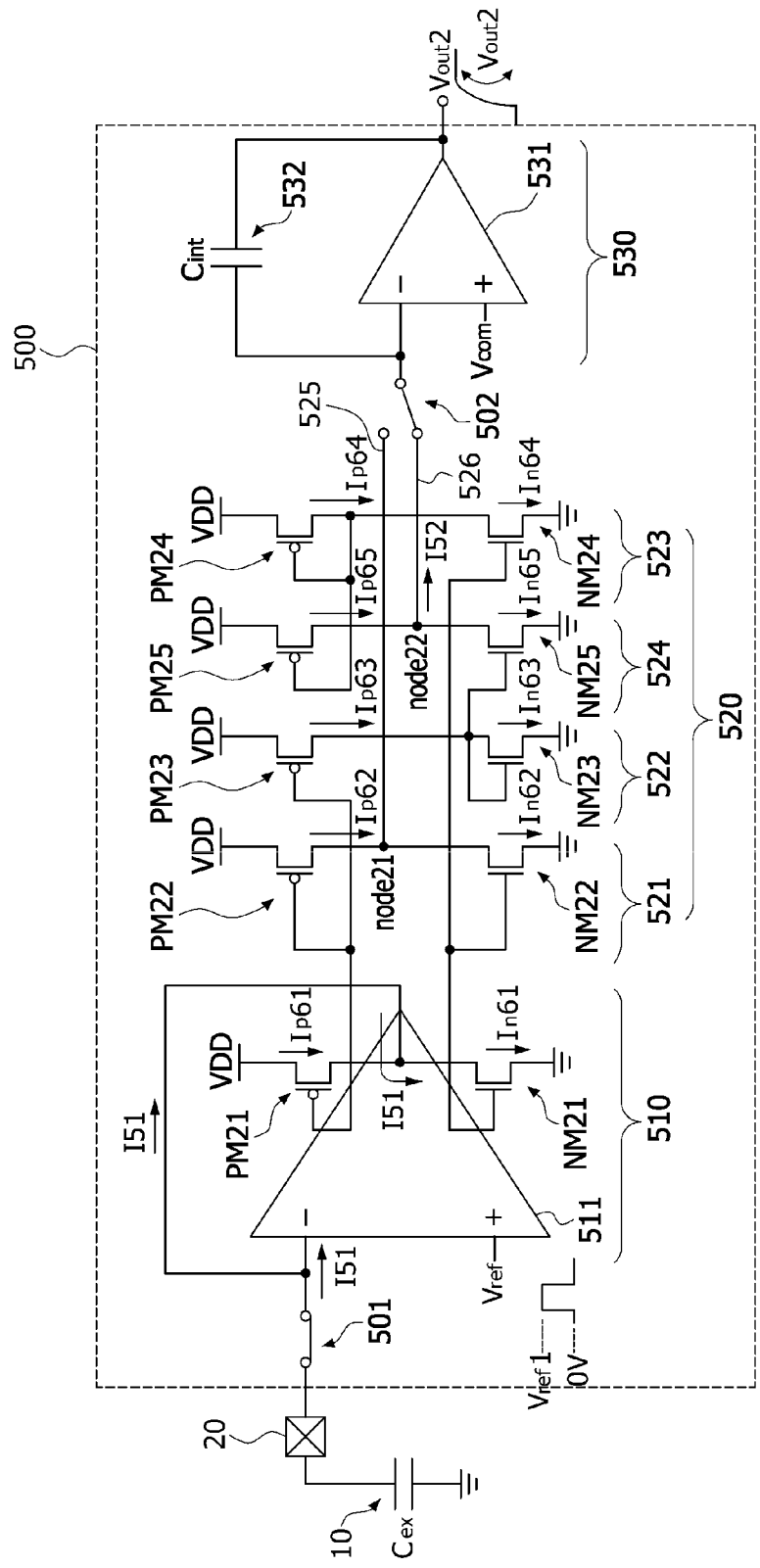
FIG. 7 is a circuit diagram illustrating a second operation step of the capacitance sensing circuit illustrated in FIG. 5.

FIG. 7 is a circuit diagram illustrating a second operation step of the capacitance sensing circuit 500 illustrated in FIG. 5. In FIG. 7, the same reference numerals or the same reference designators as those used in FIG. 5 denote the same elements. Thus, to avoid duplicate explanation, descriptions of the same elements as those set forth with reference to FIG. 5 will be omitted or briefly mentioned hereinafter. Referring to FIG. 7, during a second period when the ground voltage of the reference voltage Vref is applied to the non-inverting input terminal of the first operational amplifier 511, the switch 502 between the modulation circuit 520 and the integral circuit 530 may connect the inverting input terminal of the second operational amplifier 531 to the second output line 526 extending from the second output node NODE22. In such a case. a current Ip61 flowing through the first PMOS transistor PM21 of the output circuit of the first operational amplifier 511 may be added to an output current I51 flowing into the output terminal of the first operational amplifier 511 to provide a current In61 flowing through the first NMOS transistor NM21 of the output circuit of the first operational amplifier 511. The output current I51 may flow from the inverting input terminal of the first operational amplifier 511 toward the output terminal of the first operational amplifier 511 through the feedback path of the first operational amplifier 511. Thus, the output current I51 may correspond to a current that remains after subtracting the current Ip61 flowing through the first PMOS transistor PM21 from the current In61 flowing through the first NMOS transistor NM21.

Since the first and fourth NMOS transistors NM21 and NM24 constitute a current mirror circuit in a condition where a current drivability of the fourth NMOS transistor NM24 is one $N^{th}$ (1/N) a current drivability of the first NMOS transistor NM21, a current In64 flowing through the fourth NMOS transistor NM24 may be one $N^{th}$ (1/N) the current In61 flowing through the first NMOS transistor NM21. In such a case, a current Ip64, which is equal to the current In64 flowing through the fourth NMOS transistor NM24, may flow through the fourth PMOS transistor PM24. Since the fourth and fifth PMOS transistors PM24 and PM25 constitute a current mirror circuit and have the same current drivability, a current Ip65 flowing through the fifth PMOS transistor PM25 may be equal to the current Ip64 flowing through the fourth PMOS transistor PM24. As a result, the current Ip64 flowing through the fourth PMOS transistor PM24, current Ip65 flowing through the fifth PMOS transistor PM25, and the current In64 flowing through the fourth NMOS transistor NM24 may have an amount corresponding to one $N^{th}$ (1/N) the current In61 flowing through the first NMOS transistor NM21.

Since the first and second PMOS transistors PM21 and PM22 constitute a current mirror circuit in a condition where a current drivability of the second PMOS transistor PM22 is one $N^{th}$ (1/N) a current drivability of the first PMOS transistor PM21, a current Ip62 flowing through the second PMOS transistor PM22 may be one $N^{th}$ (1/N) the current Ip61 flowing through the first PMOS transistor PM21. In such a case, a current In62 flowing through the second NMOS transistor NM22 may be equal to the current Ip62 flowing through the second PMOS transistor PM22. Since the first and third PMOS transistors PM21 and PM23 constitute a current mirror circuit in a condition where a current drivability of the third PMOS transistor PM23 is one $N^{th}$ (1/N) a current drivability of the first PMOS transistor PM21, a current Ip63 flowing through the third PMOS transistor PM23 may be one $N^{th}$ (1/N) the current Ip61 flowing through the first PMOS transistor PM21. A current In63 which is equal to the current Ip63 flowing through the third PMOS transistor PM23 may flow through the third NMOS transistor NM23. Since the third and fifth NMOS transistors NM23 and NM25 constitute a current mirror circuit and have the same current drivability, a current In65 flowing through the fifth NMOS transistor NM25 may be equal to the current In63 flowing through the third NMOS transistor NM23. As a result, the current Ip63 flowing through the third PMOS transistor PM23, current In63 flowing through the third NMOS transistor NM23, and the current In65 flowing through the fifth NMOS transistor NM25 may have an amount corresponding to one $N^{th}$ (1/N) the current Ip61 flowing through the first PMOS transistor PM21.

The current Ip65 flowing through the fifth PMOS transistor PM25 is one $N^{th}$ (1/N) the current In21 flowing through the first NMOS transistor NM21, and the current In65 flowing through the fifth NMOS transistor NM25 is one $N^{th}$ (1/N) the current Ip61 flowing through the first PMOS transistor PM21. Therefore, a second output current I52, which flows along the second output line 526 from an output node (i.e., the second output node NODE22) of the fourth modulation circuit 524, may have an amount corresponding to one $N^{th}$ (1/N) the output current I51 flowing through the output terminal of the first operational amplifier 511. Thus, a voltage induced at the inverting input terminal of the second operational amplifier 531 may be determined depending on the second output current I52 flowing along the second output line 526. That is, the voltage induced at the inverting input terminal of the second operational amplifier 531 may be one $N^{th}$ (1/N) a voltage induced at the touch-sensing pad 20 by the external capacitor 10. Since the second output current I52 flows in a direction that is opposite to a direction in which the output current I51 of the first operational amplifier 511 flows, a phase of the voltage signal induced at the inverting input terminal of the second operational amplifier 531 illustrated in FIG. 7 may be opposite to a phase of the voltage signal induced at the inverting input terminal of the second operational amplifier 531 illustrated in FIG. 6. Accordingly, an output voltage signal Vout2 output during the second period may correspond to a signal that is half cycle phase shifted from the output voltage signal Vout1 output during the first period. As a result, a frequency of a synthesized output signal Vout output from the second operational amplifier 531 during the first and second periods may be twice a frequency of the output voltage signal Vout1 or Vout2. Since the output voltage signal Vout2 is the product of a ratio of the capacitance value Cex of the external capacitor 10 to the capacitance value Cint of the internal capacitor 532, one $N^{th}$ (1/N), and the first reference voltage value (Vref1), the output voltage signal Vout2 may be less sensitive to variations of the capacitance value Cex and the capacitance value Cint than the output signal Vout of the general capacitance sensing circuit 100 illustrated in FIG. 1. That is, even if the capacitance value Cint of the internal capacitor 532 is less than the capacitance value Cex of the external capacitor 10, the capacitance sensing circuit 500 in accordance with an embodiment may reduce the influence of the capacitance deviation between the external capacitor 10 and the internal capacitor 532 on the output voltage signal Vout2 of the capacitance sensing circuit 500.

Figure 8:
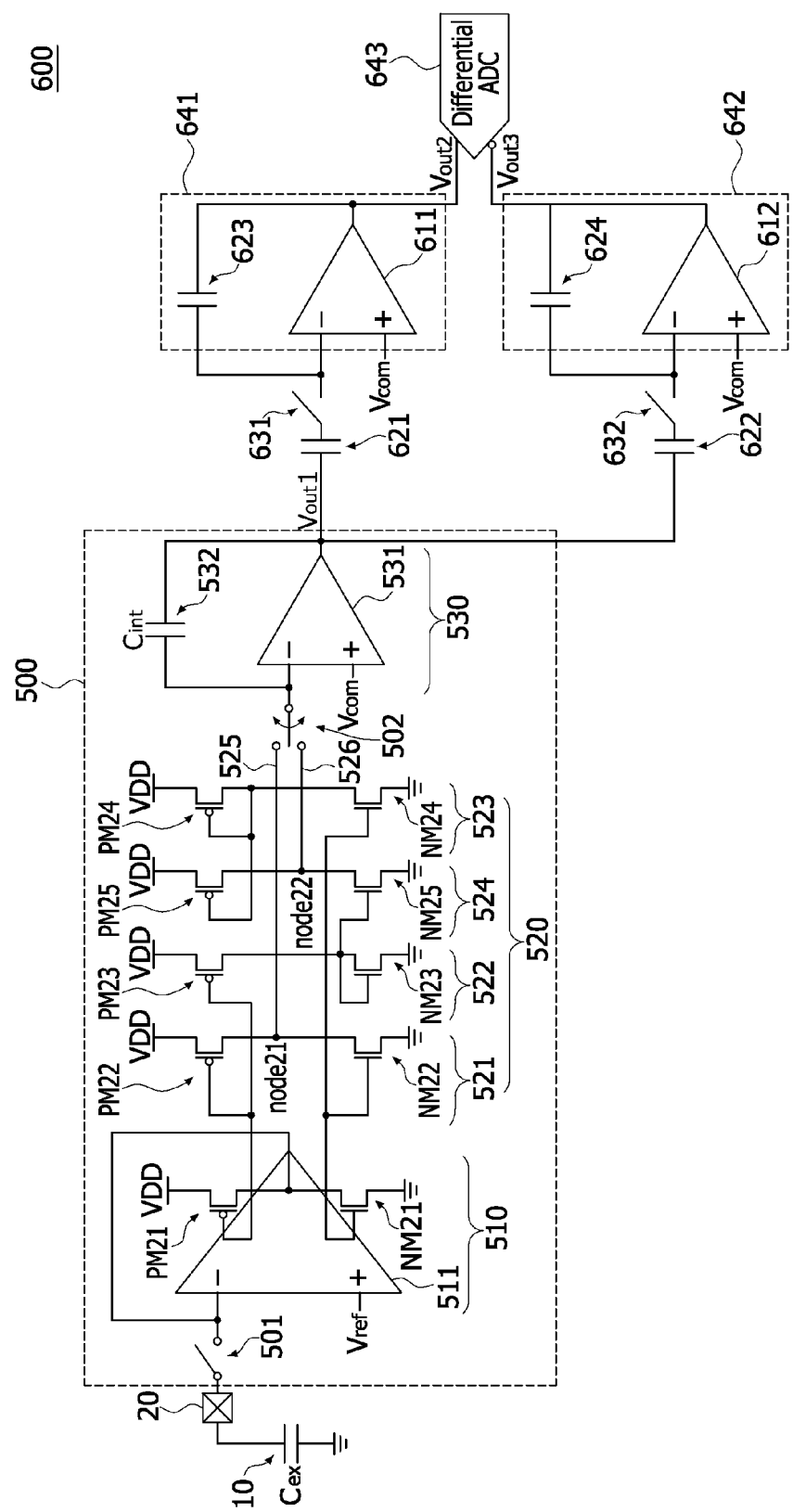
FIG. 8 is a circuit diagram illustrating a capacitance sensing circuit according to an embodiment of the present disclosure.

FIG. 8 is a circuit diagram illustrating a capacitance sensing circuit 600 according to an embodiment of the present disclosure. Referring to FIG. 8, the capacitance sensing circuit 600 may include a sampling circuit and a differential analog-digital converter (ADC) 643 in addition to the buffer circuit 510, the modulation circuit 520, and the integral circuit 530, which have been described with reference to FIG. 5. The sampling circuit may include a first sampling device 641 and a second sampling device 642. To avoid duplicate explanation, descriptions of the buffer circuit 510, the modulation circuit 520, and the integral circuit 530 will be omitted or briefly mentioned hereinafter.

The first sampling device 641 and the second sampling device 642 may be coupled in parallel to the output terminal of the integral circuit 530 (i.e., the output terminal of the second operational amplifier 531). The first sampling device 641 may include a first sampling capacitor 621, a third operation amplifier 611, and a first feedback capacitor 623. The first sampling capacitor 621 may be coupled to the output terminal of the second operational amplifier 531. An inverting input terminal of the third operation amplifier 611 may be coupled to the first sampling capacitor 621 through a first switch 631, and a common voltage Vcom may be applied to a non-inverting input terminal of the third operation amplifier 611. The first feedback capacitor 623 may be coupled between an output terminal of the third operation amplifier 611 and the inverting input terminal of the third operation amplifier 611. The second sampling device 642 may include a second sampling capacitor 622, a fourth operation amplifier 612, and a second feedback capacitor 624. The second sampling capacitor 622 may be coupled to the output terminal of the second operational amplifier 531. Accordingly, the first and second sampling capacitors 621 and 622 may be coupled in parallel to the output terminal of the second operational amplifier 531. An inverting input terminal of the fourth operation amplifier 612 may be coupled to the second sampling capacitor 622 through a second switch 632, and the common voltage Vcom may be applied to a non-inverting input terminal of the fourth operation amplifier 612. The second feedback capacitor 624 may be coupled between an output terminal of the fourth operation amplifier 612 and the inverting input terminal of the fourth operation amplifier 612.

The first and second sampling capacitors 621 and 622 may be charged if a first output voltage signal Vout1 is generated and output from the second operational amplifier 531. If first and second sampling capacitors 621 and 622 are charged enough to perform predetermined operations, the first switch 631 may be turned on, and a first sampling step may be performed by the first sampling device 641. If the first switch 631 is turned on, the first output voltage signal Vout1 may be amplified according to a ratio of a capacitance value of the first sampling capacitor 621 to a capacitance value of the first feedback capacitor 623. A second output voltage signal Vout2 may also be sampled on the basis of the common voltage Vcom input to the non-inverting input terminal of the third operational amplifier 611, and may be output through an output terminal of the third operational amplifier 611. A second sampling step may be performed by the second sampling device 642 after the first sampling step is performed. That is, if the first switch 631 is turned off and the second switch 632 is turned on, the first output voltage signal Vout1 may be amplified according to a ratio of a capacitance value of the second sampling capacitor 622 to a capacitance value of the second feedback capacitor 624. A third output voltage signal Vout3 may also be sampled on the basis of the common voltage Vcom inputted to the non-inverting input terminal of the fourth operational amplifier 612, and may be output through an output terminal of the fourth operational amplifier 612. In an embodiment, the second sampling step may be performed after a time corresponding to a half cycle of a clock signal elapses from a point in time when the first sampling step is performed. In such a case, a phase difference between the second and third output voltage signals Vout2 and Vout3 may correspond to a half cycle of the clock signal.

The differential ADC 643 may receive the second output voltage signal Vout2 output from the output terminal of the third operational amplifier 611 and the third output voltage signal Vout3 output from the output terminal of the fourth operational amplifier 612. The differential ADC 643 may perform a differential analog-to-digital converting operation on the second and third output voltage signals Vout2 and Vout3 to generate a digital output signal.

A transfer function H(z) of the first output voltage signal Vout1 output from the second operational amplifier 531 in a Z-domain may be expressed by an equation "$(1-z^{-1})$." In addition, a transfer function H(z) of the second and third output voltage signals Vout2 and Vout3 output from the first and second sampling devices 641 and 642 in a Z-domain may be expressed by an equation "$(1-z^{-1})^2$." Moreover, a transfer function H(z) of a signal output from the differential ADC 643 in a Z-domain may be expressed by an equation "$(1-z^{-1})^3$." As such, the capacitance sensing circuit 600 may perform a third-order correlated double sampling process to suppress or reduce a noise of a final output signal.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A capacitance sensing circuit comprising:
a buffer circuit coupled to an external capacitor through a touch-sensing pad and including a pull-up device and a pull-down device;
a modulation circuit including a first current mirror device having a current drivability corresponding to one $N^{th}$ (where "N" denotes a positive real number) a current drivability of the pull-up device and a second current mirror device having a current drivability corresponding to one $N^{th}$ a current drivability of the pull-down device; and
an integral circuit configured to integrate voltage values at an output node of the modulation circuit to output the integrated voltage values,
wherein the pull-up device and the first current mirror device constitute a current mirror circuit, and the pull-down device and the second current mirror device constitute another current mirror circuit.

2. The capacitance sensing circuit of claim 1, wherein the buffer circuit includes a first operational amplifier having an inverting input terminal coupled to the touch-sensing pad, a non-inverting input terminal receiving a reference voltage, and an output terminal connected to the inverting input terminal, and the pull-up device and the pull-down device constitute an output circuit of the first operational amplifier.

3. The capacitance sensing circuit of claim 2, wherein the pull-up device includes a first PMOS transistor, and the pull-down device includes a first NMOS transistor.

4. The capacitance sensing circuit of claim 3, wherein a source and a drain of the first PMOS transistor are coupled to a power supply voltage terminal and an output node, respectively, and a source and a drain of the first NMOS transistor are coupled to a ground voltage terminal and the output node, respectively.

5. The capacitance sensing circuit of claim 4, wherein the first current mirror device includes a second PMOS transistor, and the second current mirror device includes a second NMOS transistor.

6. The capacitance sensing circuit of claim 5, wherein:
a source and a drain of the second PMOS transistor are coupled to the power supply voltage terminal and a first node, respectively;
a gate of the second PMOS transistor is coupled to a gate of the first PMOS transistor;
a drain and a source of the second NMOS transistor are coupled to the first node and the ground voltage terminal, respectively; and
a gate of the second NMOS transistor is coupled to a gate of the first NMOS transistor.

7. The capacitance sensing circuit of claim 6, wherein the integral circuit includes:
a second operational amplifier having an inverting input terminal coupled to the first node and a non-inverting input terminal receiving a common voltage; and
an internal capacitor coupled between an output terminal of the second operational amplifier and the inverting input terminal of the second operational amplifier.

8. The capacitance sensing circuit of claim 1, further comprising:
a first sampling device and a second sampling device coupled in parallel to an output terminal of the integral circuit; and
a differential analog-to-digital converter configured to receive output signals of the first and second sampling devices to generate a digital output signal.

9. The capacitance sensing circuit of claim 8, wherein a phase difference between the output signals of the first and second sampling devices is a half cycle of a clock signal.

10. The capacitance sensing circuit of claim 8, wherein the first sampling device includes:
a first sampling capacitor coupled to the output terminal of the integral circuit;
a third operational amplifier having an inverting input terminal coupled to the first sampling capacitor through a first switch and a non-inverting input terminal receiving a common voltage; and
a first feedback capacitor coupled between an output terminal of the third operation amplifier and the inverting input terminal of the third operation amplifier, and wherein the second sampling device includes:
a second sampling capacitor coupled to the output terminal of the integral circuit;
a fourth operational amplifier having an inverting input terminal coupled to the second sampling capacitor through a second switch and a non-inverting input terminal receiving the common voltage; and
a second feedback capacitor coupled between an output terminal of the fourth operation amplifier and the inverting input terminal of the fourth operation amplifier.

11. A capacitance sensing circuit comprising:
a buffer circuit coupled to an external capacitor through a touch-sensing pad and including a pull-up device and a pull-down device;
a first modulation circuit including a first current mirror device having a current drivability corresponding to one $N^{th}$ (where "N" denotes a positive real number) a current drivability of the pull-up device and a second current mirror device having a current drivability corresponding to one $N^{th}$ a current drivability of the pull-down device, the pull-up device and the first current mirror device constituting a current mirror circuit, the pull-down device and the second current mirror device constituting another current mirror circuit;
a second modulation circuit including a third current mirror device having a current drivability corresponding to one $N^{th}$ a current drivability of the pull-up device and a first diode-connected device coupled between the third current mirror device and a ground voltage terminal, the pull-up device and the third current mirror device constituting a current mirror circuit;
a third modulation circuit including a fourth current mirror device having a current drivability corresponding to one $N^{th}$ a current drivability of the pull-down device and a second diode-connected device coupled between a power supply voltage terminal and the fourth current mirror device, the pull-down device and the fourth current mirror device constituting a current mirror circuit;

a fourth modulation circuit including a fifth current mirror device and a sixth current mirror device, the second diode-connected device and the fifth current mirror device constituting one current mirror circuit, the first diode-connected device and the sixth current mirror device constituting another current mirror circuit;

an integral circuit configured to integrate voltage values at one of output nodes of the first and fourth modulation circuits to output the integrated voltage values; and a switch configured to electrically connect one of the output nodes of the first and fourth modulation circuits to the integral circuit.

12. The capacitance sensing circuit of claim 11, wherein the buffer circuit includes a first operational amplifier having an inverting input terminal coupled to the touch-sensing pad, a non-inverting input terminal receiving a reference voltage, and an output terminal connected to the inverting input terminal, and the pull-up device and the pull-down device constitute an output circuit of the first operational amplifier.

13. The capacitance sensing circuit of claim 11, wherein the pull-up device includes a first PMOS transistor, and the pull-down device includes a first NMOS transistor, and wherein a source and a drain of the first PMOS transistor are coupled to the power supply voltage terminal and an output node, respectively, and a source and a drain of the first NMOS transistor are coupled to the ground voltage terminal and the output node, respectively.

14. The capacitance sensing circuit of claim 13, wherein the first current mirror device includes a second PMOS transistor, and the second current mirror device includes a second NMOS transistor, and wherein:
 a source and a drain of the second PMOS transistor are coupled to the power supply voltage terminal and an output node of the first modulation circuit, respectively;
 a gate of the second PMOS transistor is coupled to a gate of the first PMOS transistor;
 a drain and a source of the second NMOS transistor are coupled to the output node of the first modulation circuit and the ground voltage terminal, respectively; and
 a gate of the second NMOS transistor is coupled to a gate of the first NMOS transistor.

15. The capacitance sensing circuit of claim 14, wherein the third current mirror device includes a third PMOS transistor, and the first diode-connected device includes a third NMOS transistor having a gate and a drain, which are connected to each other, and wherein:
 a source and a drain of the third PMOS transistor are coupled to the power supply voltage terminal and a drain of the third NMOS transistor, respectively;
 a gate of the third PMOS transistor is coupled to a gate of the first PMOS transistor; and
 a source of the third NMOS transistor is coupled to the ground voltage terminal.

16. The capacitance sensing circuit of claim 15, wherein the fourth current mirror device includes a fourth NMOS transistor, and the second diode-connected device includes a fourth PMOS transistor having a gate and a drain connected to each other, and wherein:
 a drain and a source of the fourth NMOS transistor are coupled to a drain of the fourth PMOS transistor and the ground voltage terminal, respectively;
 a gate of the fourth NMOS transistor is coupled to a gate of the first NMOS transistor; and
 a source of the fourth PMOS transistor is coupled to the power supply voltage terminal.

17. The capacitance sensing circuit of claim 16, wherein the fifth current mirror device includes a fifth PMOS transistor, and the sixth current mirror device includes a fifth NMOS transistor, and wherein:
 a source and a drain of the fifth PMOS transistor are coupled to the power supply voltage terminal and an output node of the fourth modulation circuit, respectively;
 a gate of the fifth PMOS transistor is coupled to a gate of the fourth PMOS transistor; and
 a drain and a source of the fifth NMOS transistor are coupled to the output node of the fourth modulation circuit and the ground voltage terminal, respectively; and
 a gate of the fifth NMOS transistor is coupled to a gate of the third NMOS transistor.

18. The capacitance sensing circuit of claim 17, wherein the fourth and fifth PMOS transistors have a current drivability substantially equal to a current drivability of the fourth NMOS transistor, and the third and fifth NMOS transistors have a current drivability substantially equal to a current drivability of the third PMOS transistor.

19. The capacitance sensing circuit of claim 18, wherein the switch electrically connects the output node of the first modulation circuit to the inverting input terminal of the second operational amplifier while the reference voltage has a high level, and the switch electrically connects the output node of the fourth modulation circuit to the inverting input terminal of the second operational amplifier while the reference voltage has a low level.

20. The capacitance sensing circuit of claim 19, wherein the integral circuit includes:
 a second operational amplifier having an inverting input terminal coupled to the switch and a non-inverting input terminal receiving a common voltage; and
 an internal capacitor coupled between an output terminal of the second operational amplifier and the inverting input terminal of the second operational amplifier.

21. The capacitance sensing circuit of claim 11, further comprising:
 a first sampling device and a second sampling device coupled in parallel to an output terminal of the integral circuit; and
 a differential analog-to-digital converter configured to receive output signals of the first and second sampling devices to generate a digital output signal.

22. The capacitance sensing circuit of claim 21, wherein a phase difference between the output signals of the first and second sampling devices may correspond to a half cycle of a clock signal.

23. The capacitance sensing circuit of claim 21, wherein the first sampling device includes:
 a first sampling capacitor coupled to the output terminal of the integral circuit;
 a third operational amplifier having an inverting input terminal coupled to the first sampling capacitor through a first switch and a non-inverting input terminal receiving a common voltage; and
 a first feedback capacitor coupled between an output terminal of the third operation amplifier and the inverting input terminal of the third operation amplifier, and wherein the second sampling device includes:
 a second sampling capacitor coupled to the output terminal of the integral circuit;
 a fourth operational amplifier having an inverting input terminal coupled to the second sampling capacitor through a second switch and a non-inverting input terminal receiving the common voltage; and a second feedback capacitor coupled between an output terminal of the fourth operation amplifier and the inverting input terminal of the fourth operation amplifier.

* * * * *